United States Patent [19]

Ohgihara et al.

[11] Patent Number: 4,873,496
[45] Date of Patent: Oct. 10, 1989

[54] TUNED OSCILLATOR

[75] Inventors: Takahiro Ohgihara; Yoshikazu Murakami; Yasuyuki Mizunuma, all of Kanagawa; Hiroyuki Nakano, Tokyo, all of Japan

[73] Assignee: Sony Corporation, Tokyo, Japan

[21] Appl. No.: 281,289

[22] Filed: Dec. 8, 1988

[30] Foreign Application Priority Data

Dec. 14, 1987 [JP] Japan ................................. 62-315650

[51] Int. Cl.$^4$ ............................................. H03B 5/18
[52] U.S. Cl. ........................................ 331/96; 331/77; 331/117 D; 331/177 R
[58] Field of Search ............... 331/74, 77, 96, 107 DP, 331/107 SL, 117 D, 177 R; 333/219.2

[56] References Cited

U.S. PATENT DOCUMENTS 4,626,800 12/1986 Murakami et al. ................... 331/96

Primary Examiner—David Mis
Attorney, Agent, or Firm—Hill, Van Santen, Steadman & Simpson

[57] ABSTRACT

A tuned oscillator is disclosed which consists of an active element for oscillation, a ferrimagnetic resonant element connected to part of feedback of the active element, and a matching circuit connected to the active element. The matching cirucit is designed to reflect the fundamental wave produced by the ferrimagnetic resonant element and active and pass the second harmonic wave. Consequently, the magnetic circuit has its load reduced in applying a D.C. magnetic field necessary for frequency tuning to the ferrimagnetic resonance element.

7 Claims, 10 Drawing Sheets

TUNED OSCILLATOR

CROSS REFERENCE TO RELATED APPLICATIONS

This application is related to co-pending application Ser. No. 276,146 entitled "Tuned Oscillator Utilizing Thin Film Ferromagnetic Resonator" filed Nov. 25, 1988 assigned to the assignee of the present application in which the inventors are:
Takahiro Ohgihara
Yoshikazu Murakami
Yasuyuki Mizunuma
Hiroyuki Nakano The allowed claims in the present application are not anticipated or rendered obvious by the disclosure or claims of application Ser. No. 276,146.

BACKGROUND OF THE INVENTION

The present invention relates to a tuned oscillator used, for example, a local oscillator in microwave communication equipments.

There has been a proposal of a tuned oscillator using ferromagnetic resonance of yttrium iron garnet (YIG) thin film as shown in U.S. Pat. No. 4,626,800 assigned to the present assignee.

This YIG thin film tuned oscillator consists of an active element for oscillation, an YIG thin film resonator, a magnetic circuit for applying a D.C. magnetic field to the YIG thin film in the direction normal to the film surface, and an impedance matching circuit. The YIG thin film tuned oscillator has the oscillation condition expressed in terms of the reflection coefficient Fa seen from the reference plane between the active element and the impedance matching circuit toward the active element and the reflection coefficient Γ1 seen from the reference plane toward the load, as follows.

$$\Gamma a . \Gamma 1 \geq \tag{1}$$

The equality is established for the steady-state oscillation.

Conventionally, the impedance matching circuit has been adjusted so that a maximal fundamental wave output and minimal phase noise at the load are achieved, while retaining the condition of formula (1).

However, the ferrimagnetic resonant frequency of YIG thin film is proportional to the D.C. magnetic field applied to the YIG thin film, and if the tuned oscillator is designed to produce a high-frequency oscillation output, e.g., above 10 GHz, it is necessary to generate a strong D.C. magnetic field, resulting in an increased load to the magnetic circuit. A conceivable counter measure is to minimize the gap length in the magnetic circuit, however, a too small gap length causes adverse effects on the characteristics of YIG thin film resonator and also makes it difficult to assemble in a package.

OBJECT AND SUMMARY OF THE INVENTION

Accordingly, it is an object of the present invention to provide an improved tuned oscillator for high frequency.

It is another object of the present invention to provide a tuned oscillator in which a bias magnetic field applied to a ferromagnetic resonance element is reduced.

According to one aspect of the present invention, there is provided a tuned oscillator which comprises an active element for oscillation, a ferromagnetic resonance element connected to the active element as a part of feedback for the active element, a bias magnetic field means applying D.C. bias magnetic field to the ferromagnetic resonance element and a matching circuit connected to the active element. The matching circuit is designed to reflect a fundamental wave generated by the active element and the ferromagnetic resonance element and to pass a second harmonic wave of the fundamental wave.

BRIEF EXPLANATION OF THE DRAWINGS

FIG. 4 is used;

FIG. 1 is a Smith chart showing, as an example, the result of simulation on the reflection factor Γ1 when n=10 in FIG. 6.

DESCRIPTION OF THE PREFERRED EMBODIMENTS

In the present invention a tuned oscillator is formed of an active element (e.g., GaAs FET 1), a ferrimagnetic resonance element (e.g., YIG thin film resonator 2) connected to part of feedback of the active element, and a matching circuit (e.g., impedance matching circuit 3) connected to the active element, with the matching circuit being designed to reflect the fundamental wave produced by the ferrimagnetic resonance element and active element and pass the second harmonic wave.

In a preferable embodiment of the invention, the tuned oscillator is designed such that bias is applied to the oscillating active element through the matching circuit.

By using the second harmonic wave having a frequency twice the fundamental wave as an oscillation output, the tuned oscillator of the present invention halves the necessary D.C. magnetic field as compared with the case of using the fundamental wave in attaining the oscillation output of the same frequency, whereby the load to the magnetic circuit is reduced by that proportion.

Embodiments of this invention will be described with reference to the drawings.

EXAMPLE 1

Figure 1:
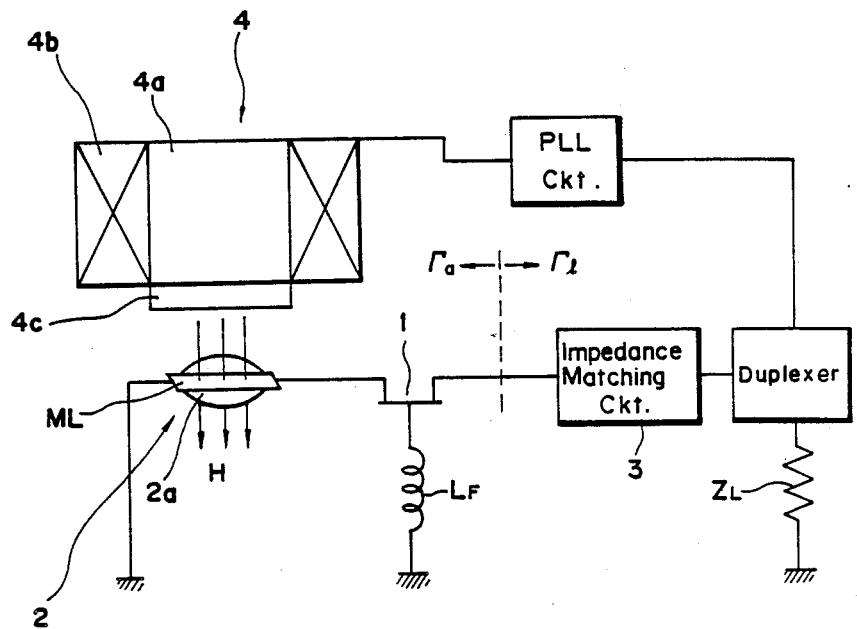
FIG. 1 is a block diagram showing the YIG thin film tuned oscillator according to the present invention.

FIG. 1 is a block diagram showing the YIG thin film tuned oscillator embodying the present invention. As shown in the figure, the YIG thin film tuned oscillator of this embodiment mainly consists of a GaAs FET 1 as an oscillating active element, an YIG thin film resonator 2, an impedance matching circuit 3, and a means 4 of applying a D.C. magnetic field to the YIG thin film resonator 1. The YIG thin film tuned oscillator is connected on its output with a load impedance expressed as $Z_L$. The YIG thin film tuned Oscillator has the condition of oscillation expressed by the aforementioned formula (1).

The YIG thin film resonator 2 has the structure similar to that described in detail in U.S. Pat. No. 4,626,800, and it has the formation of a YIG thin film disk 2a one main surface of a GGG (gadorinium gallium garnet) substrate (not shown), for example. Actually, the YIG thin film resonator 2 is formed together with the GaAs FET 1 on the surface on one side of a dielectric substrate such as alumina, for example. The YIG thin film disk is placed on a microstrip line formed the surface of the dielectric substrate, while on another surface of the dielectric substrate, there is formed a ground conductor. Symbol ML indicates the microstrip line in a sense of model.

The above-mentioned GaAs FET 1 has its source connected to the microstrip line ML and its drain connected to the impedance matching circuit 3. The gate of the GaAs FET 1 is grounded through a feedback reactance $L_F$. Namely, the YIG thin film tuned oscillator of this embodiment is a tuned oscillator of the common gate, serial feedback type.

The D.C. magnetic field application means 4 is made up of a tuning coil 4b wound on a pole piece 4a which constitutes part of the yoke of the magnetic circuit, and a permanent magnet 4c. The fixed magnetic field produced by the permanent magnet 4c and the variable magnetic field produced by the tuning coil 4b are merged to form a D.C. magnetic field H and applied to the YIG thin film resonator 2. The YIG thin film resonator 2 is inserted in a gap of a magnetic circuit including the D.C. magnetic field application means. The D.C. magnetic field H can be controlled to the magnitude needed for frequency tuning by varying the current flowing in the tuning coil 4b. Among the magnetic field H needed for frequency tuning, a fixed component is generated from the fixed magnetic field of the permanent magnet 4c and a variable component is generated from the variable magnetic field of the tuning coil 4b.

In the YIG thin film tuned oscillator of the example, which is intended to use the second harmonic as the oscillation output, the impedance matching circuit 3 is designed such that the generation of the second harmonic is promoted, while suppressing the fundamental wave output. For the suppression of the fundamental wave output, the reflection coefficient Γl for the fundamental wave seen toward the load, as shown in FIG. 1, needs to be virtually equal to 1. With this condition being met, virtually no fundamental wave output appears on the load, and it is virtually totally reflected toward the active element. Conversely, it is necessary for the second harmonic wave to have the absolute value of reflection factor Γl virtually equal to 0. If this condition is met, the second harmonic wave is virtually totally passed, and the output is delivered through the load. The formula (1) representing the condition of oscillation is met as regards the absolute value, whereas the phase condition: $\theta a + \theta l = 0$ ($\theta a$ and $\theta l$ are phases of Γa and Γl) can be satisfactory through the adjustment of the line length between the drain of GaAs FET 1 as an active element and the impedance matching circuit 3.

Figure 2:
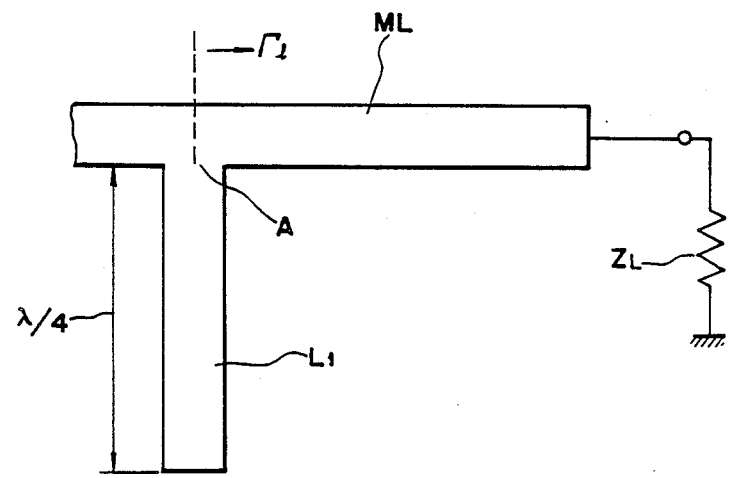
FIG. 2 is a plan view showing a specific arrangement of the impedance matching circuit used in the YIG thin film tuned oscillator shown in FIG. 1.

A specific arrangement of the impedance matching circuit 3 is shown in FIG. 2. In the figure, the impedance matching circuit 3 comprises a main line ML having a characteristic impedance of 50 Ω, for example, and an open-ended line (open stub) L1 having a quarter wavelength (λ/4) of the fundamental wave extended perpendicular from the main line ML. The provision of the quarter wavelength line L1 behaves as to short-circuit for the fundamental wave and open for the second harmonic wave at the junction A. Consequently, the intended characteristics of suppressing the fundamental wave output and lending the second harmonic output is accomplished.

Figure 3:
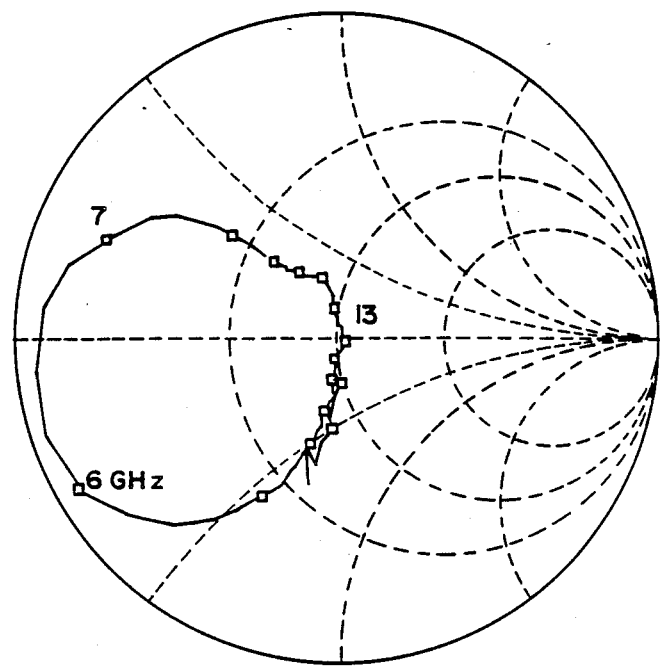
FIG. 3 is a smith chart showing, as an example, the measurement result of the reflection factor Γ1 when the impedance matching circuit shown in FIG. 2 is used.

FIG. 3 shows the plot of measured reflection coefficient Γl in the case of using the impedance matching circuit shown in FIG. 2 with the fundamental frequency being set to 6.5 GHz. The measurement was conducted by increasing the oscillation frequency. As will be appreciated from FIG. 3, the circuit operates to virtually short-circuit, i.e., Γl=−1, for the fundamental 6.5 MHz, while it provides about 50 Ω, i.e., Γl=0, for a 13 GHz second harmonic wave.

The example 1, in which the impedance matching circuit 3 consists of the quarter wavelength line L1 appended to the main line ML, is capable of suppressing the fundamental wave output, while lending the second harmonic output. Accordingly, by using the second harmonic wave for the oscillation output, the necessary D.C. magnetic field is halved as compared with the case of using the fundamental wave for producing the output of the same frequency. As a result the load to the magnetic circuit can also be halved. Specifically, the tuning sensitivity by the tuning coil 4b is doubled, and the current supplied to the tuning coil 4b can be halved for the same bandwidth. It also becomes possible to have a higher oscillation frequency, e.g., above 10 GHz, without reducing the gap length of the magnetic circuit, allowing the YIG thin film resonator 2 to be fitted easily in the gap, and it is free from adverse effects on the characteristics of the YIG thin film resonator. Furthermore, in producing a high frequency, e.g., above 10 GHz, it becomes possible to use a bipolar transistor of low phase noise in place of the FET 1.

Owing to a high Q value of the YIG thin film resonator 2, the YIG thin film tuned oscillator is low in phase noise, and moreover its use of magnetic resonance results in satisfactory linear tuning characteristics. The YIG thin film tuned oscillator, when used for the local oscillator in microwave communication equipments, promises high quality communication.

Although most of the fundamental wave output is suppressed as described above, a small part thereof is outputted and this low-frequency fundamental component can be used, for example, as an input signal to a prescaler of PLL circuit.

Figure 6:
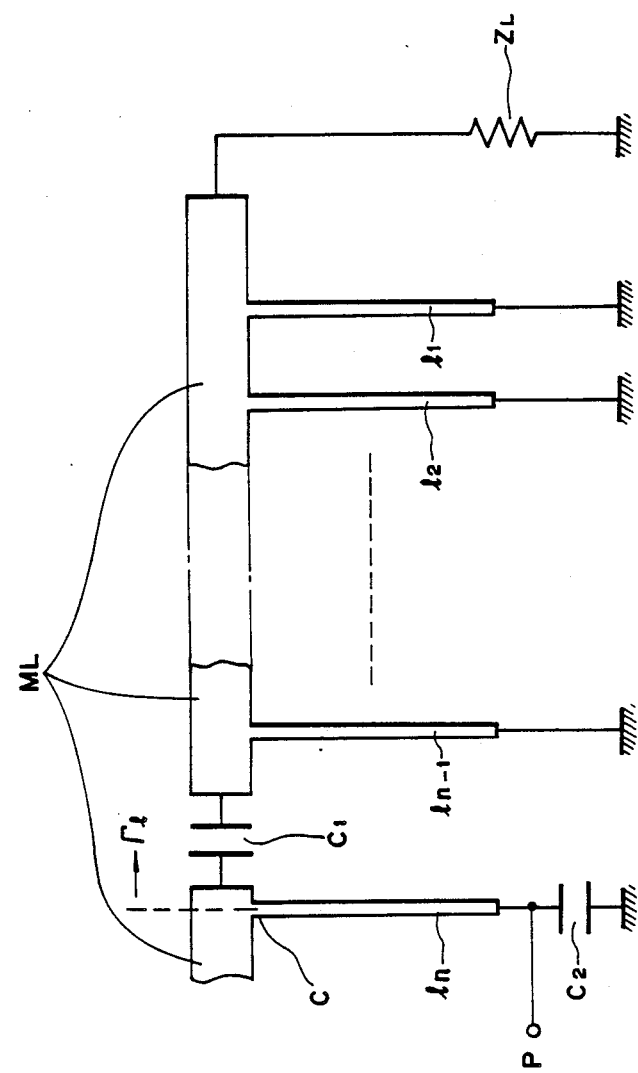
FIG. 6 is a plan view showing a specific arrangement of the impedance matching circuit used in the YIG thin film tuned oscillator according to further example of the present invention.

In FIG. 6 by use of a duplexer 6 the fundamental wave and the second harmonic wave are separated, and the fundamental wave is fed to the prescaler of the PLL (phase lock loop) circuit 5.

The frequency of the fundamental wave is compared with a reference signal in PLL and a control current is derived and fed to the tuning coil 4b to stabilize the oscillation.

Although the line L1 of the impedance matching circuit 3 has its length fixed to the quarter wavelength of a specific fundamental wave and therefore the line length is not exactly a quater wavelength of other fundamental frequencies, it can be considered as an approximate quarter wavelength within a band of several hundred MHz centered by the center frequency of the specific fundamental wave, and tuning within the band is possible while suppressing the fundamental wave output.

The following describes other examples of the invention, in which a bias application to the drain of the GaAs FET 1 is taken into consideration, in contrast to the preceding embodiment without the consideration.

EXAMPLE 2

Figure 4:
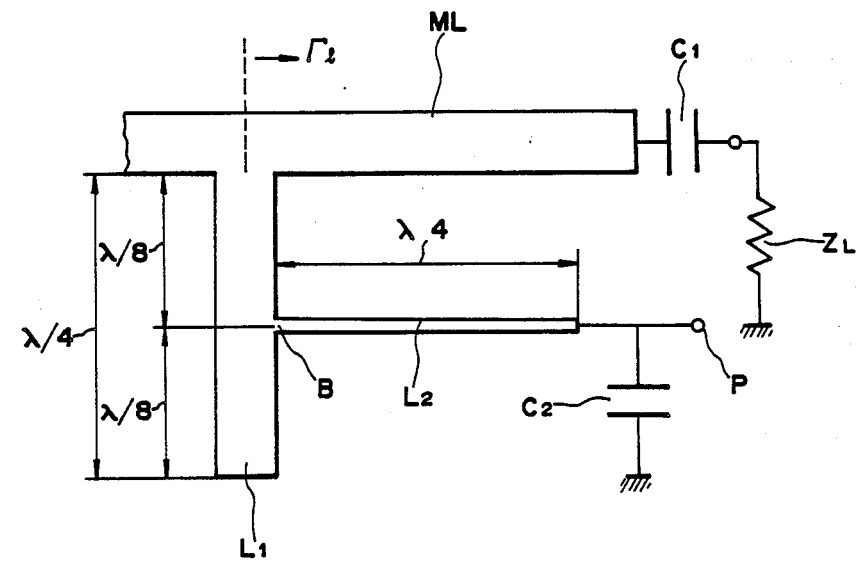
FIG. 4 is a plan view showing a specific arrangement of the impedance matching circuit used in the YIG thin film tuned oscillator according to another example of the present invention.

The YIG thin film tuned oscillator of this embodiment employs an impedance matching circuit as shown in FIG. 4. The impedance matching circuit 3 comprises a line L1 having a quarter wavelength $\lambda/4$, similar to that of the example 1, which extends at its central section perpendicularly to form a quarter wavelength line L2. The extended quarter wavelength line L2 has its end connected to the bias application terminal P and the drain of the GaAs FET 1, and is also grounded through a capacitor C2 by which RF components are grounded. Provided at the end of the main line ML is a D.C. blocking capacitor C1, by which the bias is applied only to the drain of the GaAs FET 1 and it is prevented from leaking to the outside.

In the example 2, the impedance matching circuit is open at the junction B of the line L2 of quarter wavelength of fundamental wave, and the line L2 does not affect the quarter wavelength line L1, resulting in the same condition as the example 1. On the other hand, the circuit is short-circuited at the junction B for the second harmonic wave, but the center of the quarter wavelength L1 is also short-circuited, and therefore the quarter wavelength line L2 does not affect the quarter wavelength L1.

Figure 5:
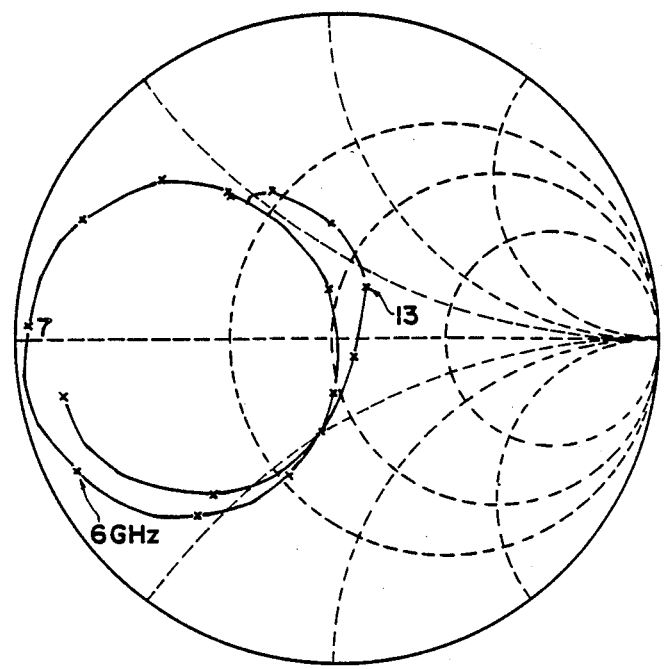
FIG. 5 is a Smith chart showing, as an example, the measurement result of the reflection factor Γ1 when the impedance matching circuit shown

FIG. 5 shows the plot of the measured reflection coefficient $\Gamma 1$ in the case of using the impedance matching circuit 3 as shown in FIG. 4. As will be appreciated from FIG. 5, $\Gamma 1$ is approximately equal to $-1$ for the fundamental wave of 6.5 GHz, and it is virtually equal to 0 for the second-order harmonic wave of 13 GHz.

The example 2 is capable of suppressing the fundamental wave output and lending the second harmonic output, as in the example 1, and the second harmonic wave is used favorably as the oscillation output as in the example 1. In addition, the bias to the drain of the GaAs FET-1 can be given by the impedance matching circuit 3.

EXAMPLE 3

The YIG thin film tuning oscillator of this embodiment employs an impedance matching circuit as shown in FIG. 6. The impedance matching circuit 3 comprises a main line M, which has multiple extensions of lines (short stubs) $1_1$-$1_n$ of quarter wavelength of second harmonic wave, with their ends being grounded. A D.C. blocking capacitor C1 is provided between the quarter wavelength lines $1_n$-1 and $1_n$ with the intention of biasing to the drain of the GaAs FET 1, and the quarter wavelength line $1_n$ is grounded through an RF bypass capacitor C2.

Figure 7:
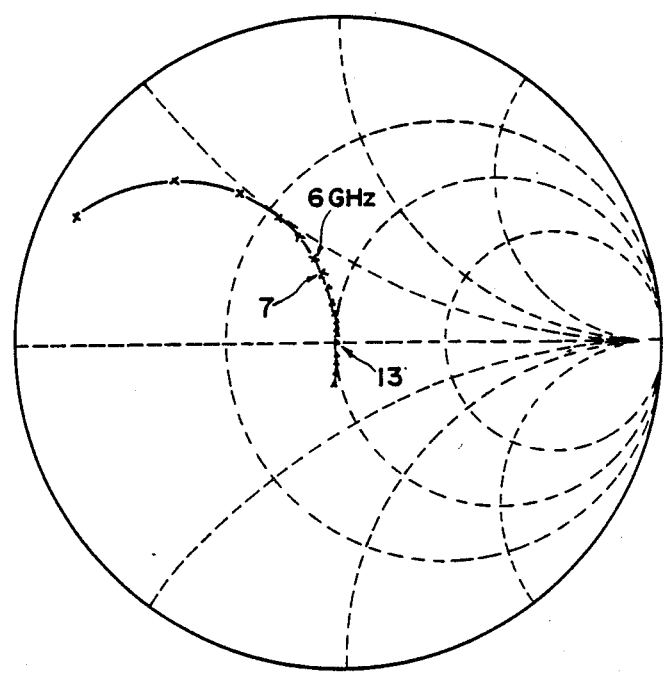
FIG. 7 is a Smith chart showing, as an example, the result of simulation the reflection factor Γ1 when n=1 in FIG. 6.

For n=1, i.e., the provision of only one-fourth wavelength line, the impedance matching circuit is open at the junction C for the second harmonic with $\Gamma 1$ being virtually 0, while it does not short-circuit for the fundamental wave and the condition of $|\Gamma 1|=1$ is not met. Namely, as will be appreciated from the result of simulation shown in FIG. 7, the value of $|\Gamma 1|$ in the case of n=1 falls to a value as small as 0.25 at frequencies around the fundamental frequency (6.5 GHz) with respect to the second harmonic (13 GHz).

Figure 8:
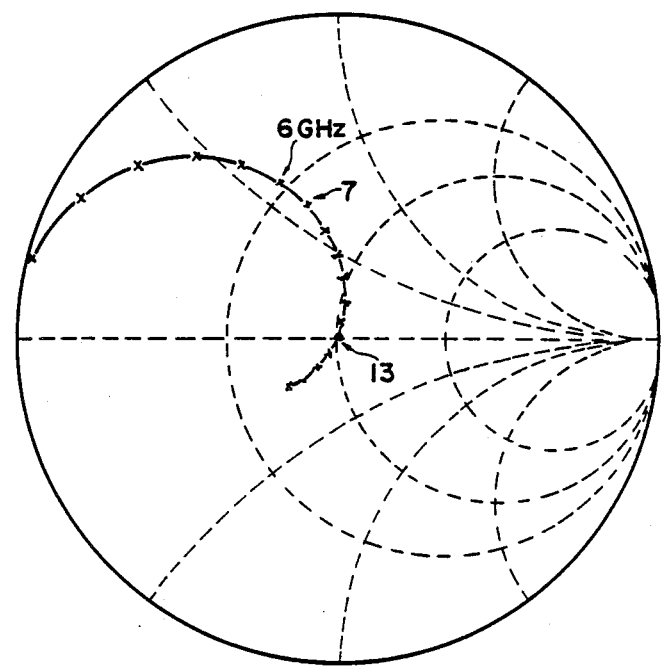
FIG. 8 is a Smith chart showing, as an example, the result of simulation on the reflection factor Γ1 when n=2 in FIG. 6.
Figure 9:
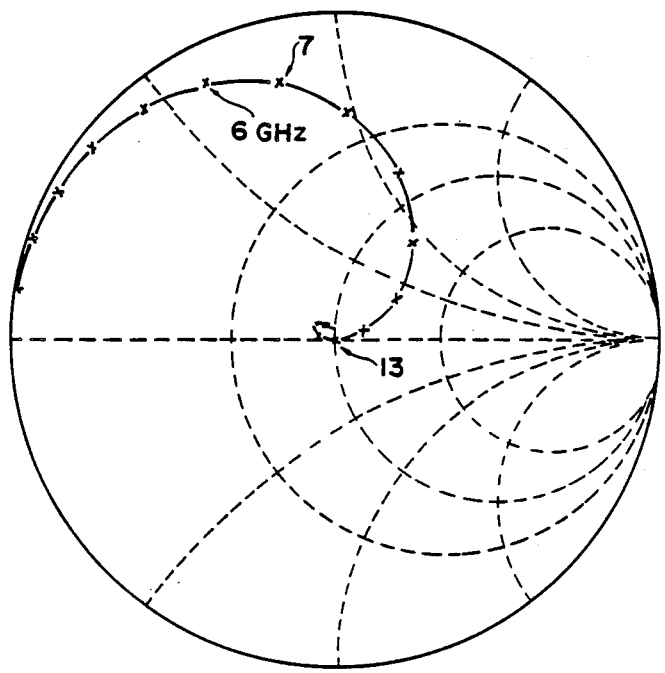
FIG. 9 is a Smith chart showing, as an example, the result of simulation of the reflection factor Γ1 when n=5 in FIG. 6.
Figure 10:
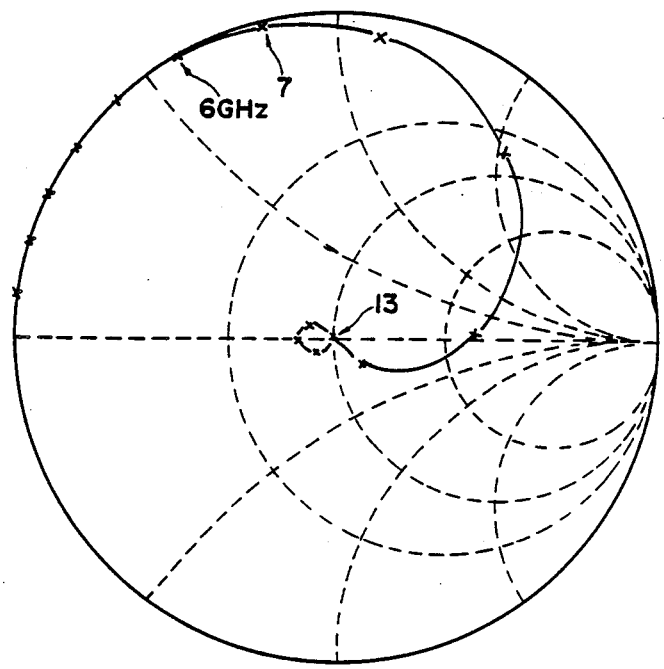

This problem can be overcome by connecting multiple lines $1_1$-$1_n$ of quarter wavelength of the second harmonic, With their ends being grounded, to the man line ML, as described above, so that the reflection of fundamental wave is increased. As will be appreciated from the result of simulation for the cases of n=2, 5 and 10 shown in FIGS. 8, 9 and 10, respectively, the larger the number of quarter wavelength lines $1_1$-$1_n$ (i.e., the larger the value of n), the nearer is the value of $|\Gamma 1|$ to 1, and at n=10 the value of $|\Gamma 1|$ becomes greater than 0.95. Accordingly, the conditions of $|\Gamma 1|=1$ for the fundamental wave and $\Gamma 1=0$ for the second harmonic can virtually be met. The embodiment 3 has the same advantages as of the preceding examples 1 and 2.

Although specific embodiments of this invention have been described, the invention is not confined to these embodiments, but various modifications are possible within the technical spirit of the invention. For example, the lines L1 and L2 of quarter wavelength of fundamental wave and the lines $1_1$-$1_n$ of quarter wavelength of second harmonic wave can have their width determined according to each requirement. The arrangement of the resonator section including the magnetic circuit is not confined to those employed in the foregoing embodiments 1, 2 and 3.

According to this invention, the matching circuit is designed such that the fundamental wave generated by the ferrimagnetic resonant element and active element is reflected and the second harmonic wave is passed, whereby the load to the magnetic circuit, which applies a D.C. magnetic field necessary for frequency tuning to the ferrimagnetic resonant element, can be reduced.

We claim as our invention:

1. A. tuned oscillator comprising;
   an active element for oscillation,
   a ferromagnetic resonance element formed of a ferrimagnetic thin film and a transmission line connected as a part of feedback for said active element,
   a matching circuit connected to said active element,
   and a bias magnetic field means applying a D.C. bias magnetic field to said ferrimagnetic thin film,
   said matching circuit being designed to reflect a fundamental wave generated by said ferromagnetic resonance element and said active element and to pass a second harmonic wave of said fundamental wave.

2. A tuned oscillator according to claim 1, said matching circuit comprises a main transmission line connected to said active element and a load, and a open stub having a length substantially equal to a quarter wavelength of said fundamental wave connected to said main-transmission line.

3. A tuned oscillator according to claim 1, said matching circuit comprises a main transmission line connected to said active element and a load, a open stub having a length substnatially equal to a quarter wavelength of said fundamental wave connected to said main transmission line, and a second stub having a length substantially equal to a quater wavelength of said fundamental wave connected to a middle portion of said open stub and a bias voltage to said active element is applied through said second stub.

4. A tuned oscillator according to claim 1, said matching circuit comprises a main transmission line connected to said active element and a load, and a short stub having a length substantially equal to a quarter wavelength of said second harmonic wave connected to said main transmission line.

5. A tuned oscillator according to claim 1, said matching circuit comprises a main transmission line connected to said active element and a load, and a plurality of short stubs connected to said main transmission line each having a length substnatially equal to a quarter wavelength of said second harmonic wave.

6. A tuned oscillator according to claim 1, said bias magnetic field means are formed of a permanent magnet and a coil.

7. A tuned oscillator according to claim 6, further comprises a PLL circuit provided with said fundamental wave and deriving a control current fed to said coil.

* * * * *